United States Patent
Verhaverbeke et al.

(10) Patent No.: US 10,283,344 B2
(45) Date of Patent: May 7, 2019

(54) SUPERCRITICAL CARBON DIOXIDE PROCESS FOR LOW-K THIN FILMS

(71) Applicant: Applied Materials, Inc., Santa Clara, CA (US)

(72) Inventors: Steven Verhaverbeke, San Francisco, CA (US); Han-Wen Chen, San Mateo, CA (US); Roman Gouk, San Jose, CA (US); Kurtis Leschkies, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 171 days.

(21) Appl. No.: 15/325,419

(22) PCT Filed: Jul. 10, 2015

(86) PCT No.: PCT/US2015/039974
§ 371 (c)(1),
(2) Date: Jan. 10, 2017

(87) PCT Pub. No.: WO2016/007874
PCT Pub. Date: Jan. 14, 2016

(65) Prior Publication Data
US 2017/0148624 A1 May 25, 2017

Related U.S. Application Data

(60) Provisional application No. 62/023,671, filed on Jul. 11, 2014.

(51) Int. Cl.
*H01J 37/32* (2006.01)
*H01L 21/02* (2006.01)
*H01L 21/67* (2006.01)

(52) U.S. Cl.
CPC .... *H01L 21/0206* (2013.01); *H01L 21/02101* (2013.01); *H01L 21/02164* (2013.01); *H01L 21/02203* (2013.01); *H01L 21/02216* (2013.01); *H01L 21/02282* (2013.01); *H01L 21/02334* (2013.01); *H01L 21/02343* (2013.01); *H01L 21/02348* (2013.01); *H01L 21/6719* (2013.01); *H01L 21/67034* (2013.01); *H01L 21/67051* (2013.01); *H01L 21/67173* (2013.01); *H01L 21/67207* (2013.01); *H01J 37/32357* (2013.01)

(58) Field of Classification Search
CPC .......... H01L 21/0206; H01L 21/02101; H01L 21/02216; H01L 21/02282; H01L 21/02334; H01L 21/02348; H01L 21/02164; H01L 21/02203; H01L 21/02343; H01L 21/67207; H01L 21/67034; H01L 21/67051; H01L 21/67173; H01L 21/6719; H01J 37/32357

USPC ....... 427/240, 336, 344, 350, 352, 377, 444; 118/50

See application file for complete search history.

(56) References Cited

U.S. PATENT DOCUMENTS

| | | | |
|---|---|---|---|
| 6,306,564 B1 * | 10/2001 | Mullee | G03F 7/422 134/1.3 |
| 6,334,266 B1 | 1/2002 | Moritz et al. | |
| 6,524,429 B1 * | 2/2003 | Nogami | H01L 21/02126 118/313 |
| 6,562,146 B1 | 5/2003 | DeYoung et al. | |
| 6,764,552 B1 | 7/2004 | Joyce et al. | |
| 6,793,836 B2 | 9/2004 | Tsung-Kuei et al. | |
| 6,843,855 B2 | 1/2005 | Verhaverbeke | |
| 6,905,555 B2 * | 6/2005 | DeYoung | B08B 7/0021 134/2 |
| 7,384,484 B2 | 6/2008 | Muraoka et al. | |
| 2002/0195121 A1 | 12/2002 | Kittle | |
| 2003/0022487 A1 | 1/2003 | Yoon et al. | |
| 2003/0075536 A1 | 4/2003 | Mack et al. | |
| 2003/0084918 A1 | 5/2003 | Kim | |
| 2003/0102017 A1 | 6/2003 | Taniyama | |
| 2003/0172954 A1 * | 9/2003 | Verhaverbeke | B08B 3/12 134/1.3 |
| 2004/0198066 A1 | 10/2004 | Verhaverbeke | |

(Continued)

FOREIGN PATENT DOCUMENTS

| | | |
|---|---|---|
| CN | 1958177 A | 5/2007 |
| CN | 1960813 A | 5/2007 |

(Continued)

OTHER PUBLICATIONS

Miller et al., "In Search of Low-k Dielectrics," Science Oct. 15, 1999, vol. 286, Issue 5439, pp. 421-423. (Year: 1999).*
Wakayama et al., "A novel method for tailoring porous structures of nanoporous materials using supercritical solvents," Phys. Chem. Chem. Phys., 2003, 5, 3784-3788. (Year: 2003).*

(Continued)

*Primary Examiner* — William P Fletcher, III
(74) *Attorney, Agent, or Firm* — Patterson + Sheridan LLP

(57) ABSTRACT

The present disclosure generally relates to apparatus and methods for forming a low-k dielectric material on a substrate. The method includes various substrate processing steps utilizing a wet processing chamber, a solvent exchange chamber, and a supercritical fluid chamber. More specifically, a dielectric material in an aqueous solution may be deposited on the substrate and a solvent exchange process may be performed to prepare the substrate for a supercritical drying process. During the supercritical drying process, liquids present in the solution and remaining on the substrate from the solvent exchange process are removed via sublimation during the supercritical drying process. The resulting dielectric material formed on the substrate may be considered a silica aerogel which exhibits a very low k-value.

19 Claims, 8 Drawing Sheets

(56) References Cited

U.S. PATENT DOCUMENTS

| | | |
|---|---|---|
| 2005/0191861 A1 | 9/2005 | Verhaverbeke |
| 2005/0242064 A1 | 11/2005 | Saito et al. |
| 2006/0135047 A1* | 6/2006 | Sheydayi .......... H01L 21/67057 451/41 |
| 2006/0185694 A1* | 8/2006 | Brown ................ B08B 7/0021 134/26 |
| 2006/0226117 A1* | 10/2006 | Bertram ........... H01L 21/02057 216/59 |
| 2006/0254615 A1* | 11/2006 | Kevwitch ............... G03F 7/427 134/2 |
| 2007/0012337 A1* | 1/2007 | Hillman ............... B08B 7/0021 134/1.3 |
| 2007/0221252 A1 | 9/2007 | Kiyose |
| 2007/0287277 A1 | 12/2007 | Kolics et al. |
| 2007/0295365 A1 | 12/2007 | Miya et al. |
| 2008/0153276 A1 | 6/2008 | Hwang et al. |
| 2008/0224379 A1 | 9/2008 | McNamara |
| 2009/0151754 A1 | 6/2009 | Zhu et al. |
| 2011/0146909 A1 | 6/2011 | Shih et al. |
| 2012/0055405 A1 | 3/2012 | Koelmel et al. |
| 2012/0085495 A1 | 4/2012 | Lee et al. |
| 2013/0302982 A1 | 11/2013 | Tung et al. |
| 2013/0318812 A1 | 12/2013 | Kim et al. |
| 2014/0144462 A1 | 5/2014 | Verhaverbeke et al. |
| 2015/0262859 A1 | 9/2015 | Balasubramanian et al. |

FOREIGN PATENT DOCUMENTS

| | | |
|---|---|---|
| CN | 102386052 A | 3/2012 |
| EP | 1172458 A2 | 1/2002 |
| JP | 2004-249189 A | 9/2004 |
| JP | 2005-116759 A | 4/2005 |
| JP | 2005-138063 A | 6/2005 |
| JP | 2006-179913 A | 7/2006 |
| JP | 2012-124441 A | 6/2012 |
| JP | 2012-204656 A | 10/2012 |
| JP | 2014-241450 A | 12/2014 |
| KR | 10-0171945 | 3/1999 |
| KR | 10-2005-0032943 A | 4/2005 |
| KR | 20050063720 A | 6/2005 |
| KR | 10-0730348 B1 | 6/2007 |
| KR | 20070113096 A | 11/2007 |
| KR | 10-2008-0002633 | 1/2008 |
| KR | 10-0822373 B1 | 4/2008 |
| KR | 10-2013-0063761 | 6/2013 |
| KR | 10-2014-0115795 A | 10/2014 |
| WO | 2010/036575 A2 | 4/2010 |
| WO | 2012133583 A1 | 10/2012 |

OTHER PUBLICATIONS

Zhang et al., "Applications of supercritical carbon dioxide in materials processing and synthesis," RSC Adv., 2014, 4, 61137-61152. (Year: 2014).*

Taiwan Office Action in related application TW 102140520 dated Apr. 17, 2017.

International Search Report and Written Opinion, PCT/US2015/039974, dated Oct. 29, 2015.

International Search Report an Written Opinion for International Application No. PCT/US2016/051341 dated Dec. 20, 2016.

International Search Report & Written Opinion dated Mar. 17, 2014 for Application No. PCT/US2013/071314.

International Search Report and Written Opinion of related application PCT/US2016/051480 dated Jan. 5, 2017.

International Search Report and Written Opinion of related application PCT/US2016/051520 dated Dec. 26, 2016.

International Search Report and Written Opinion for related application PCT/US2016/051582 dated Dec. 22, 2016.

* cited by examiner

SUPERCRITICAL CARBON DIOXIDE PROCESS FOR LOW-K THIN FILMS

BACKGROUND

Field

Embodiments of the present disclosure generally relate to a method for forming a low-k dielectric material on a semiconductor substrate. More specifically, embodiments described herein relate to a process of forming a low-k film that includes the use of a supercritical $CO_2$ process.

Description of the Related Art

For advanced node technologies, interconnect RC delay (switching performance) and power dampening due to capacitance are critical thresholds of device performance. Given the scaling performance limitations of conventional low-k materials in lowering the dielectric constant (k value) as a result of compromising mechanical strength and current leakage performance, one promising candidate for capacitance scaling includes the adoption of air gaps or porous structures between metal wiring. Air gaps, which have a k value near 1.0, help reduce the overall effective k value to acceptable levels within the device. However, air gap integration generally includes additional processing steps, including exclusion mask lithography, dielectric recess, liner deposition, dielectric deposition, dielectric chemical mechanical polishing (CMP), etc. Moreover, the lack of any material in the air gap may compromise the structural integrity of the air gap, which may lead to device failure.

Other concerns regarding the formation of low-k materials are also prevalent. Most current wet cleaning techniques utilize a liquid spraying or immersion step to clean a substrate. Drying of the substrate that has high aspect ratio features and/or low-k materials, which have voids or pores, is very challenging. Capillary forces created between the cleaning liquid and the substrate surfaces found within pores, vias or other similar substrate structures often cause deformation of materials in these structures, which can create undesired stiction that can damage the semiconductor device and/or substrate. Since capillary forces are often quite large, a residual amount of cleaning solution and/or residue may also be left within these small structures after standard drying processes are performed on the substrate. The aforementioned drawbacks are especially apparent on substrates with high-aspect-ratio semiconductor device structures using conventional thermal drying techniques on the substrate. Current workable drying practices are facing an ever increasing challenge as a result of rapid device scaling advancements.

Thus, there is a need for improved methods of forming and/or cleaning low-k materials formed on a substrate.

SUMMARY

In one embodiment, a method for forming a dielectric material on a substrate is provided. The method includes exposing a substrate to an aqueous solution in a first processing chamber and wet transferring the substrate to a second processing chamber. The substrate may be exposed to a solvent in the second processing chamber and wet transferred to a third processing chamber. The solvent may be provided to the third processing chamber and the solvent may be removed by providing liquid $CO_2$ and supercritical $CO_2$ to the third processing chamber. The third processing chamber may be heated and pressurized to obtain a supercritical fluid in the third processing chamber and the third processing chamber may then be depressurized.

In another embodiment, a method for forming a dielectric material on a substrate is provided. The method includes exposing a substrate to an aqueous solution comprising tetraethylorthosilicate in a wet processing chamber. The substrate may be transferred to a solvent exchange chamber with a layer of the aqueous solution remaining on the substrate. The substrate may be exposed to acetone in the solvent exchange chamber and the substrate may be wet transferred to a supercritical fluid chamber with a layer of the acetone remaining on the substrate. The acetone may be provided to the supercritical fluid chamber and the acetone may be removed by providing liquid $CO_2$ to the supercritical fluid chamber and pressurizing the supercritical fluid chamber. The supercritical fluid chamber may be heated, supercritical $CO_2$ may be provided to the supercritical fluid chamber, and the supercritical fluid chamber may be depressurized.

In yet another embodiment, a substrate processing system for forming a dielectric material on a substrate is provided. The processing system includes a platform which includes a wet processing chamber which may be configured to expose a substrate to an aqueous solution via a spin-on process. A solvent exchange chamber having a distillation unit coupled thereto is also provided. The solvent exchange chamber may be configured to expose the substrate to a solvent. A supercritical fluid chamber is provided and may be configured to form a supercritical fluid therein. The supercritical fluid chamber may have at least one inlet configured to receive liquid $CO_2$ and supercritical $CO_2$ and at least one outlet. The inlet and the outlet may be oriented on opposite sides of the supercritical fluid chamber. The processing system also includes a robot which may be configured to transfer the substrate between the wet processing chamber, the solvent exchange chamber, and the supercritical fluid chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to apparatus and methods for forming a low-k dielectric material on a substrate. The method includes various substrate processing steps utilizing a wet processing chamber, a solvent exchange chamber, and a supercritical fluid chamber. More specifically, a dielectric material in an aqueous solution may be deposited on a substrate and a solvent exchange process may be performed to prepare the substrate for a supercritical drying process. During the supercritical drying process, liquids present in the solution and remaining on the substrate from the solvent exchange process are removed via sublimation and/or viscous flow during the supercritical drying process. The resulting dielectric material on the substrate may be low-k material, such as a silica aerogel that exhibits a very low k-value.

Figure 1:
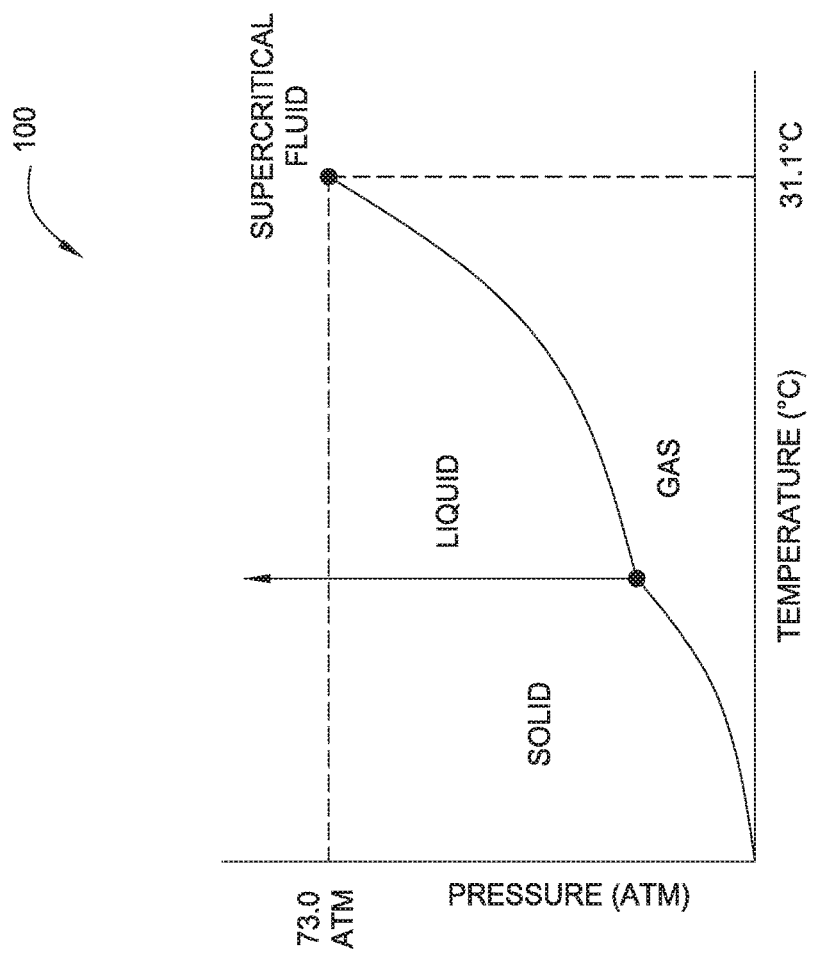
FIG. 1 (Prior Art) illustrates a phase change diagram representative of $CO_2$.

FIG. 1 (Prior Art) illustrates a phase change diagram 100 for $CO_2$. Various embodiments described herein utilize supercritical $CO_2$, and thus the diagram 100 may be useful for understanding the relationships between various physical states of $CO_2$ during different phases of the super critical drying process. Since supercritical $CO_2$ is a supercritical gas, it has no appreciable surface tension (e.g., has a surface tension similar to a gas), but has densities that are similar to a liquid. FIG. 1 illustrates that supercritical $CO_2$ has a critical point at a pressure of about 73.0 atm and a temperature of about 31.1° C. One unique property of a supercritical fluid, such as $CO_2$, is that condensation will not occur at any pressure above the supercritical pressure and temperatures above the supercritical temperature (e.g., 31.1° C. and 73 atm for $CO_2$). The region to the right of the critical temperature and above critical pressure (e.g. 73 atm for $CO_2$) defines the supercritical state of the $CO_2$ drying gas.

Figure 2A:
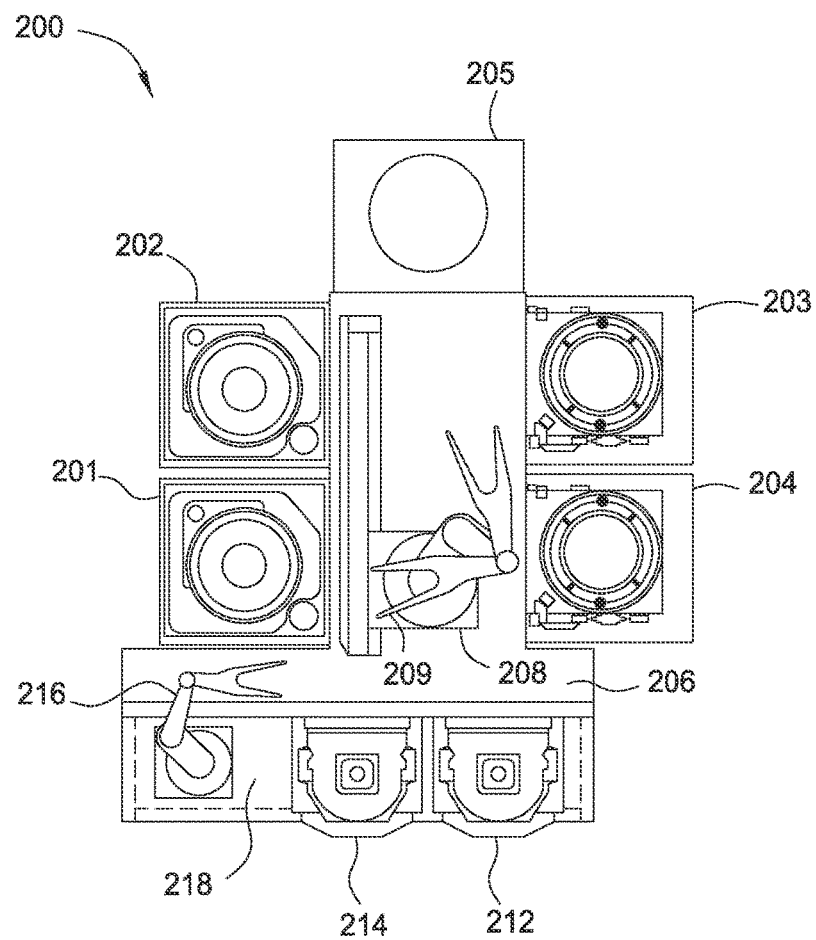
FIG. 2A illustrates a plan view of one embodiment of a processing apparatus described herein.

FIG. 2A illustrates a substrate processing apparatus 200 that may be adapted to perform one or more of the operations described below with regard to FIG. 3. The processing apparatus 200 may be used to perform one or more parts of a semiconductor fabrication processing sequence. The semiconductor fabrication processing sequence may include, but is not limited to, a process used to form electrical devices such as transistors, capacitors, or resistors, that are interconnected by metal lines, which are insulated by interlayer dielectrics upon the substrate. These processes may include cleaning the substrate, cleaning films formed on the substrate, drying the substrate, and/or drying films formed on the substrate. In one embodiment, the processing apparatus 200 comprises a wet processing chamber 201, a solvent exchange chamber 202, a supercritical fluid chamber 203, a post processing chamber 204, a transfer chamber 206, and a wet robot 208. As illustrated in FIG. 2A, the processing apparatus 200 may be a cluster tool. In another embodiment, the processing apparatus 200 includes an inspection chamber 205, which may include tools (not shown) to inspect substrates that have been processed in the processing apparatus 200.

The processing apparatus 200 may also comprise film deposition chambers (not shown) such as a chemical vapor deposition (CVD) chamber, an atomic layer deposition (ALD) chamber and/or a physical vapor deposition (PVD) chamber. The chambers may be positioned about the wet robot 208 which may be disposed in the transfer chamber 206. The wet robot 208 comprises a motor, a base, an arm, and an end effector 209 configured to transfer substrates between the chambers. Optionally, the wet robot 208 may have multiple arms and multiple end effectors to increase the throughput of the processing apparatus 200. In one embodiment, the wet robot 208 transfers substrates between the aforementioned chambers.

In another embodiment, at least one of the end effectors of the wet robot 208 is a dedicated dry end effector (e.g., adapted to handle dry wafers) and at least one of the end effectors of the wet robot 208 is a dedicated wet end effector (e.g., adapted to handle wet wafers). The dedicated dry end effector may be used to transfer substrates between the supercritical fluid chamber 203 and the post processing chamber 204. The processing apparatus 200 also comprises a dry robot 216 disposed in a factory interface 218 which may be coupled to the processing apparatus 200 and a plurality of substrate cassettes 212 and 214, each holding a plurality of substrates to be cleaned or dried, or that have been cleaned or dried. The dry robot 216 may be configured to transfer substrates between the cassettes 212 and 214 and the wet processing chamber 201 and post processing chamber 204. In another embodiment, the dry robot 216 may be configured to transfer substrates between the supercritical fluid chamber 203 and the post processing chamber 204. The processing chambers within the processing apparatus 200 may be placed on a horizontal platform which houses the substrate transfer chamber 206.

Figure 2B:
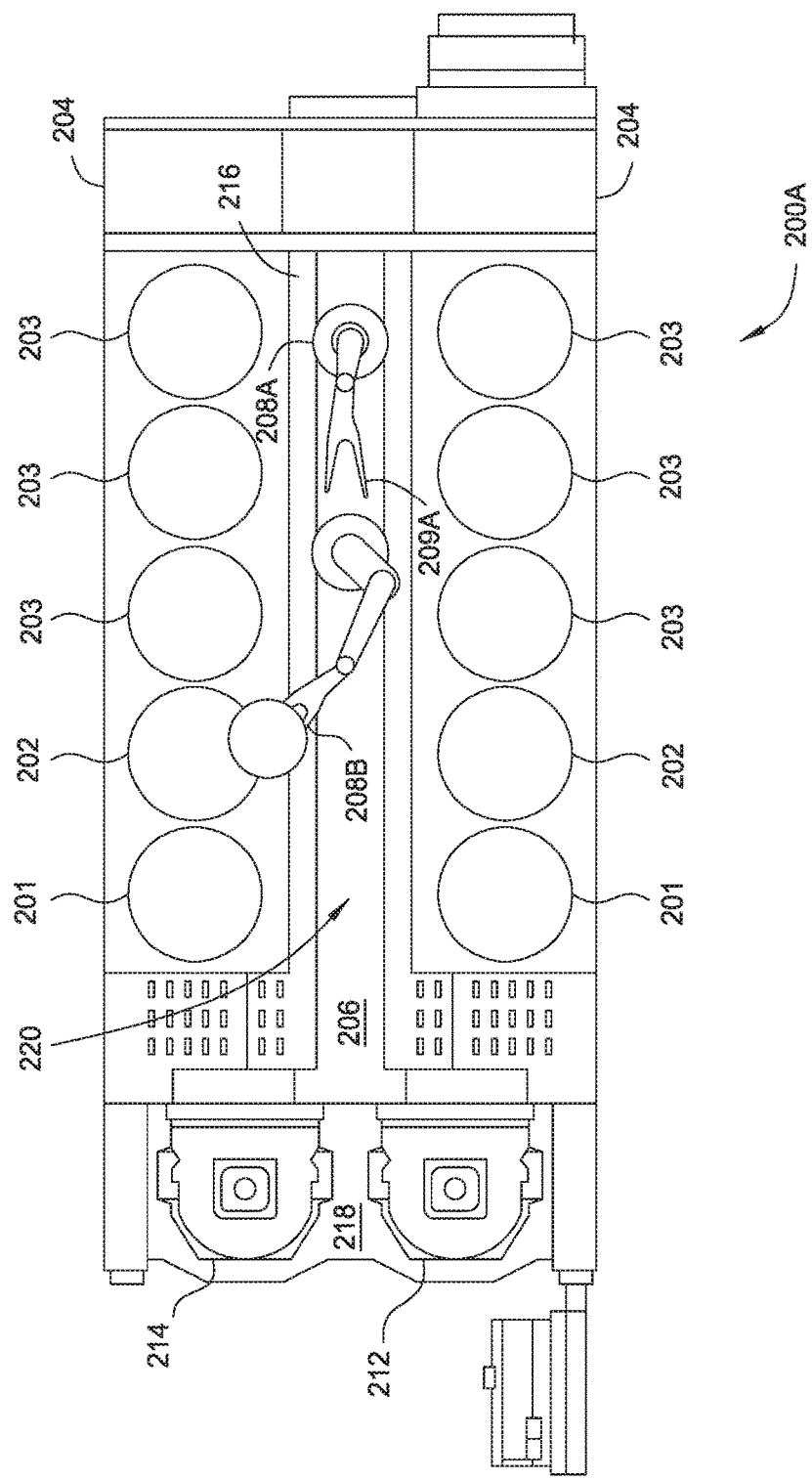
FIG. 2B illustrates a plan view of one embodiment of a processing apparatus described herein.

In an alternate embodiment, as shown in FIG. 2B, the processing apparatus 200A may be a linear apparatus comprising several substrate processing chambers. The processing apparatus 200A may include a wet processing chamber 201, a solvent exchange chamber 202, a supercritical fluid chamber 203, a post processing chamber 204, and a transfer chamber 206. In one embodiment, the processing apparatus 200A may include two or more wet processing chambers 201, two or more solvent exchange chambers 202, and two or more supercritical fluid chambers 203. In one embodiment, one or more post processing chambers 204 may be located remotely from the processing apparatus 200A or integrated into the processing apparatus 200A. In one example, the processing apparatus 200A may include two wet processing chambers 201, two solvent exchange chambers 202, and ten supercritical fluid chambers 203. For example, the processing apparatus 200A may be the Raider® GT available from Applied Materials, Santa Clara, Calif., however it is contemplated that other processing apparatuses from other manufacturers may be adapted to perform the embodiments described herein.

In general, the processing apparatus 200A may also comprise film deposition chambers (not shown) such as a CVD chamber, an ALD chamber and/or a PVD chamber. The chambers may be positioned about a robot 208A which may be disposed in the transfer chamber 206. The robot 208A comprises a motor, a base, an arm, and end effectors 209A and 209B configured to transfer substrates between the chambers. The robot 208A may have multiple arms and multiple end effectors to increase the throughput of the processing apparatus 200A. In one embodiment, the robot 208A, having a dedicated wet end effector 209A, transfers substrates between the aforementioned chambers. The processing apparatus 200A may also comprise a factory interface 218 which may be coupled to the processing apparatus 200A and a plurality of substrate cassettes 212 and 214, each holding a plurality of substrates to be cleaned or dried, or that have been cleaned or dried. The robot 208A, having the dedicated dry end effector 209B, transfers substrates between the cassettes 212 and 214 and the wet processing chamber 201 and post processing chamber 204. In one embodiment, the dedicated dry end effector 209B may be configured to transfer substrates between the supercritical fluid chamber 203 and the post processing chamber 204. The chambers within the processing apparatus 200A may be placed on a horizontal platform which houses the substrate transfer chamber 206.

In some configurations of the processing apparatus 200A, the robot 208A may travel along a linear track 220. Chambers may be arranged in sequence on one or both sides of the linear track 220. To perform wet substrate transfer, excess liquid may be removed from the substrate, such as by rotating the substrate, while still in the chamber so only a thin wet layer remains on the substrate surface before the robot 208A transfers the substrate. In embodiments providing two or more end effectors on the robot 208A, at least one may be dedicated to wet substrate transfer and the other one may be dedicated to dry substrate transfer. More chambers may be installed in the extendable linear configuration for high-volume production.

The configurations referred to in the previous embodiments greatly reduce design complexities of each chamber, enable queue time control between sensitive process steps, and optimize throughput in continuous production with adjustable chamber module count to equalize process duration of each step. In one example, a substrate may be processed for between about one minute and about three minutes in the wet processing chamber 201, between about one minute and about three minutes in the solvent exchange chamber 202, and between about five minutes and about fifteen minutes in the supercritical fluid chamber 203.

Figure 3:
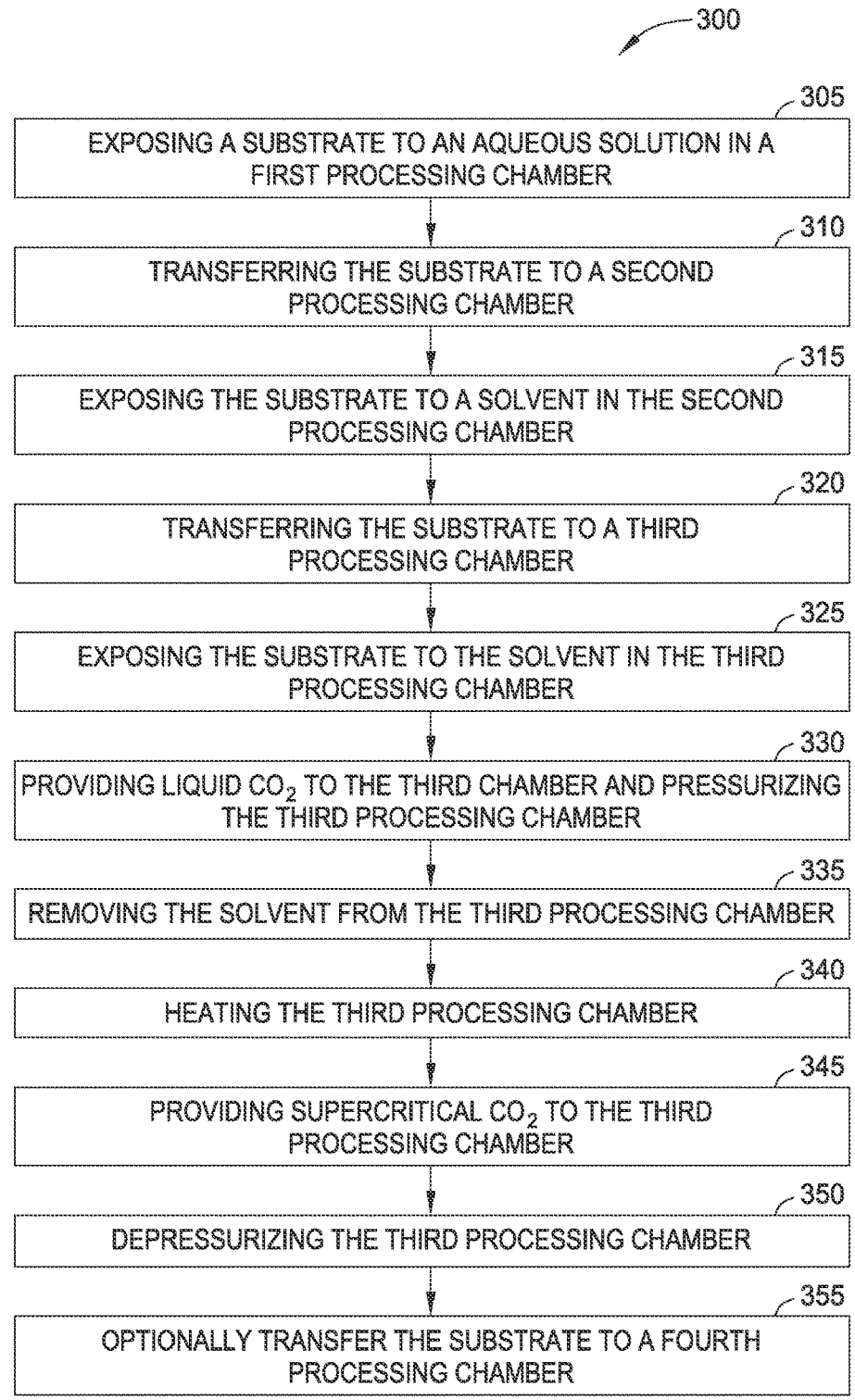
FIG. 3 illustrates operations of a method for forming a dielectric material on a substrate according to one embodiment described herein.

FIG. 3 illustrates operations of a method 300 for forming a low-k dielectric material on a substrate. More specifically, the operations provide for a method of forming a silica aero gel containing structure. It is believed that the silica aero gel formed utilizing the method 300 may have a k-value of less than about 2, for example between about 1.0 and about 1.2. Further, it is contemplated that each of the wet processing chamber 201, solvent exchange chamber 202, supercritical fluid chamber 203, and post processing chamber 204 may be adapted to perform the embodiments described in the method 300.

At operation 305, a substrate may be exposed to an aqueous solution in a first processing chamber. The first processing chamber may be the wet processing chamber 201 described with regard to FIGS. 2A and 2B and the aqueous solution may include a silicon containing compound. In one example, the aqueous solution comprises tetraethylorthosilicate (TEOS), water, ethanol, and ammonia. However, it is contemplated that other materials, such as flowable dielectric materials, may be utilized for deposition of a dielectric layer on the substrate. The first processing chamber may be configured to rotate the substrate during exposure to the aqueous solution. As a result, a flowable dielectric layer may be formed on the substrate. An exemplary dielectric layer formation process is a spin on dielectric process.

At operation 310, the substrate may be transferred to a second processing chamber. The second processing chamber may be the solvent exchange chamber 202 and the substrate transfer process may be a wet process. For example, a layer of the aqueous solution may remain on the substrate during transfer of the substrate to the second processing chamber. The substrate transfer process may be performed by a robot, such as the wet robot 208 or 208A illustrated in FIG. 2A or 2B.

At operation 315, the substrate may be exposed to a solvent in the second processing chamber (e.g., solvent exchange chamber 202). The solvent may be one or more organic compounds which exhibit desired solvating properties. In one example, the solvent utilized in the second processing chamber may be acetone. The substrate is exposed to the solvent and various components of the aqueous solution present on the substrate may be displaced by the solvent. It is believed that water and/or other components of the aqueous solution may be displaced by the solvent but that a silicon containing compound of the solvent may remain on the substrate. After processing the substrate in the second processing chamber, a thin layer of solvent may remain on the substrate.

At operation 320, the substrate may be transferred to a third processing chamber. The third processing chamber may be the supercritical fluid chamber 203 and the substrate transfer process may be a wet process. For example, a layer of the solvent may remain on the substrate during transfer of the substrate to the third processing chamber. The substrate transfer process may be performed by a robot, such as the wet robot 208 or 208A.

At operation 325, the substrate may be exposed to a solvent in the third processing chamber. The additional exposure to a solvent further removes any undesirable materials or liquids from the substrate and prepares the substrate for supercritical processing, such as a supercritical drying process. In one embodiment, the solvent provided to the third processing chamber may be the same solvent utilized in the second processing chamber, such as the solvent applied to the substrate in operation 315. For example, the solvent provided to the third processing chamber may be acetone. Alternatively, the solvent provided to the third processing chamber may be a different solvent than the solvent utilized in the second processing chamber. It is contemplated that additional exposure to the solvent in the third processing chamber is beneficial for forming a low-k material on the substrate by removing water which may be present on the substrate without heating the substrate. The substrate's exposure to the solvent in operation 325 may prevent curing of the low-k material. By removing water from the substrate without heating the substrate, the low-k material may avoid undesirable densification. As a result, the low-k material may be characterized by a predominantly porous structure.

At operation 330, liquid $CO_2$ may be provided to the third processing chamber and the third processing chamber may be pressurized. The liquid $CO_2$ may be provided to a region 511 (FIG. 5A) of the third processing chamber below the substrate. Simultaneously with the providing the liquid $CO_2$ to the third processing chamber, the pressure of a processing volume of the third processing chamber may be increased. By providing liquid $CO_2$, it is contemplated that the solvent removal of operation 335 may be enhanced prior to the supercritical drying process of operations 340-350. By carefully transitioning the environment of the substrate from a non-supercritical environment to a supercritical environment, it is believed that the structure of the low-k material on the substrate may be preserved.

At operation 335, the solvent may be removed from the third processing chamber. The solvent may be removed from the chamber via an outlet 513 (FIG. 5A) in a bottom of the chamber and additional liquid $CO_2$ may be optionally provided to the third processing chamber during the removal of the solvent. However, it is contemplated that the pressure maintained in the third chamber may remain substantially constant during the removal of the solvent from the third processing chamber. The solvent removal, which is an isobaric process, substantially prevents structural changes of the low-k material. For example, the pore structure of the low-k material may be preserved without an appreciable increase in density of the low-k material. Further, it is believed that even after the solvent has been removed from the third processing chamber, a thin layer of solvent may remain on the surface of the substrate in a primarily $CO_2$ environment.

At operation 340, the third processing chamber may be heated. One or more heaters may heat the third processing chamber to a desired temperature. For example, the temperature, in combination with the pressure of the third processing chamber, may be configured to form and/or maintain a supercritical fluid in the chamber. In one embodiment, the temperature and pressure may be adequate to maintain $CO_2$ in a supercritical state.

At operation 345, supercritical $CO_2$ may be provided to the third processing chamber. Liquid $CO_2$ present in the third processing chamber may be removed from the chamber via an outlet 513 (FIG. 5) or may be converted into supercritical $CO_2$. In operation 345, supercritical $CO_2$ may be provided to the third processing chamber until all of the fluid in the chamber is a supercritical fluid. It is believed that utilizing a supercritical fluid, such as supercritical $CO_2$, for drying the substrate provides for a condensation free drying process. Additionally, the solvent layer remaining on the substrate may be solvated by the supercritical $CO_2$ and removed from the substrate via a supercritical venting process.

At operation 350, the third processing chamber may be depressurized. During the depressurization, the supercritical venting process may proceed. The supercritical venting process provides for a low contaminant drying process. Liquid removed from the silicon containing material deposited on the substrate may be considered a silica aero gel. The silica aero gel typically has a dielectric constant of about 1.1, among other desirable dielectric material properties.

Figure 4:
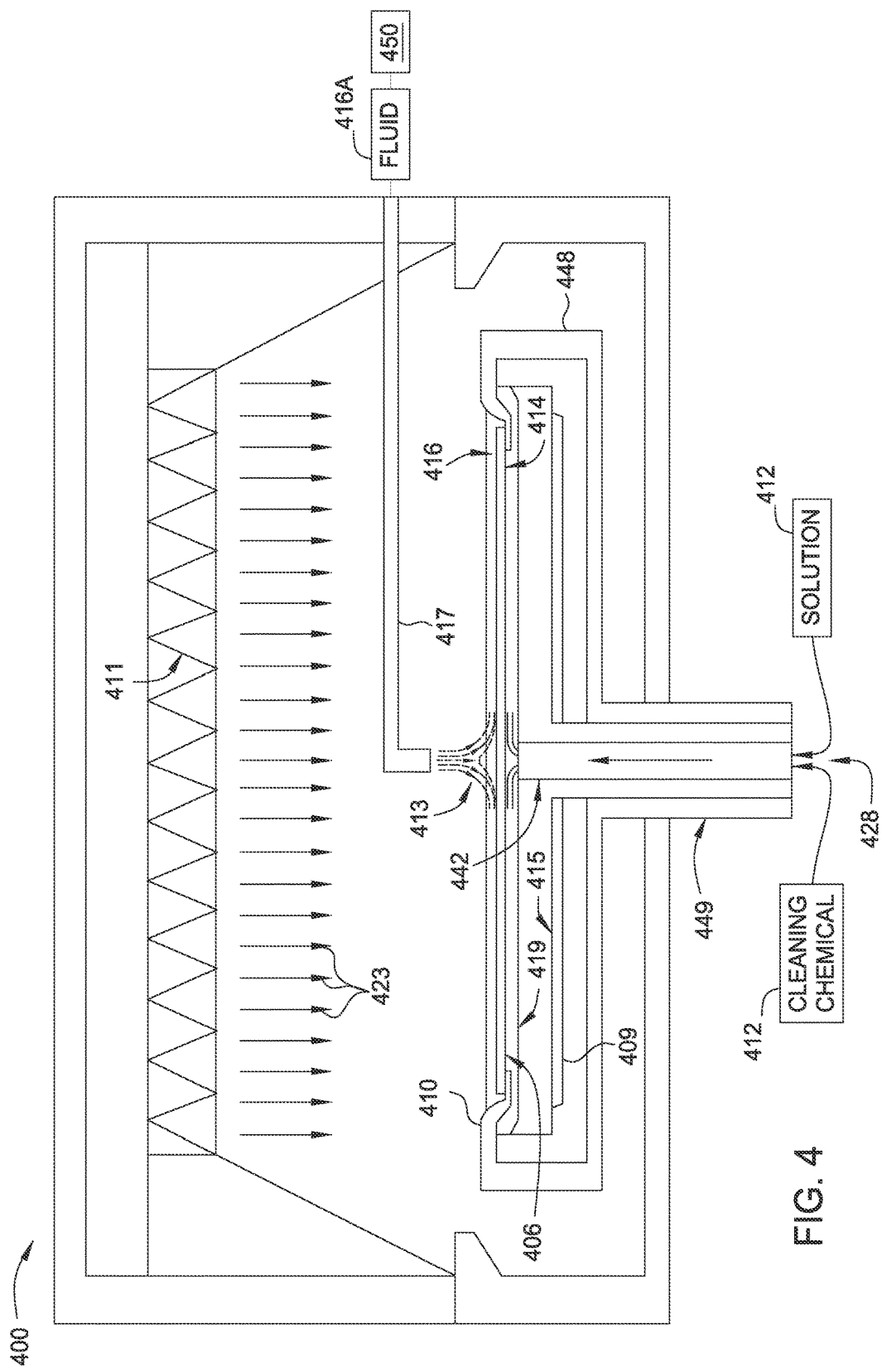
FIG. 4 illustrates a cross-sectional view of a wet processing chamber according to one embodiment described herein.

Optionally, at operation 355, the substrate may be transferred to a fourth processing chamber. The fourth processing chamber may be the post processing chamber 204 and the transfer of the substrate from the third processing chamber to the fourth processing chamber may be a dry transfer. The substrate may be processed in the fourth processing chamber to remove any contaminants present remaining on the substrate. For example, exposing the substrate to ultraviolet light in the fourth processing chamber may be used to remove undesirable organic contaminants FIG. 4 illustrates a cross-sectional view of a wet processing chamber 400. It is contemplated that the wet processing chamber 400, depicted in FIG. 4, may be utilized as the wet processing chamber 201 and/or as the solvent exchange chamber 202. In one embodiment, the wet processing chamber 400 may be a single substrate processing chamber. Alternatively, the wet processing chamber may be capable of processing multiple substrates at the same time. A first surface 416 of the substrate 406 may be exposed to cleaning, rinsing, and drying solutions 412, while the second surface 414 of the substrate 406 may not exposed to any solutions. The substrate's second surface 414 (which could be the substrate non-device side) may be facing down to be exposed to solutions provided from a source 412. In another embodiment, both the substrate's first surface 416 and the second surface 414 may be exposed to one or more solutions provided from sources 416A and 412. In one embodiment, the solutions provided from sources 416A and 412 during operation 305 may be aqueous solutions and the solutions provided from sources 416A and 412 during operation 315 may be solvent containing solutions.

In one embodiment, the chamber 400 includes a rotatable substrate holding bracket (bracket) 448, which translates along an axis of rotation device 449. The rotation device 449 may further be coupled to an electronic motor (not shown) which may rotate the bracket 448. The chamber 400 also includes an access door (not shown) through which a robot arm (not shown) holding the substrate 406 may enter to place the substrate in the bracket 448. In one embodiment, the substrate 406, when positioned in the bracket 448, may rest on support clips 410 and a vertical support post included in the bracket 448. The bracket 448, together with the support posts, may raise or lower the substrate 406 to a desirable position.

The bracket 448 may rotate the substrate 406 while solutions 412 are dispensed from below during a processing cycle. In another embodiment, the bracket 448 may rotate the substrate 406 while solutions 412 are dispensed from another nozzle on the top and/or the bottom surface of the substrate 406 during the processing cycle. As such, the bracket 448 may be configured to rotate the substrate 406 in a horizontal plane during various processing operations.

In one embodiment, the chamber 400 also includes a tube 428 connected to a through hole (feed port) 442. During a cleaning cycle, cleaning fluids or chemicals may be introduced through the tube 428 from a cleaning chemical source 412. As a result of substrate 406 rotation (spin), the solution from source 412 may be applied to the second surface 414. A nozzle 417 located above the substrate 406 may dispense solutions to the top surface 416 of the substrate 406 from a fluid source 416A. A distillation unit 450 may also be coupled to the fluid source 416A to distill fluid reclaimed from a drain (not shown) found in the bottom of the chamber 400. The distillation unit 450 can be used to reclaim solvents used during the process described in the operation 315, which is discussed above. In one embodiment, the distillation unit 450 may be configured to remove contaminants found in a reclaimed portion of a solvent material (e.g., acetone) that has been placed in contact with the surface of substrate at least once.

The chamber 400 may also include a filter 411, such as a High Efficiency Particulate Arresting (HEPA) filter or an Ultra Low Penetration Air (ULPA) filter. A downward flow of air 423 from the filter 411 and gravity may act to maintain the substrate 406 positioned to the bracket 448.

In another embodiment, the chamber 400 may also include other nozzles (not shown) that allow one or more solutions to be delivered to the first surface 416. Thus, a first group of solutions may be transferred to the substrate second surface 414 while solutions from a different source (a second group of solutions) may be transferred to a substrate first surface 416. Solutions that can be applied to either surface of the substrate may include aqueous solutions including TEOS, water, and ammonia, among others, or cleaning solutions, such as solvents which may comprise acetone, isopropyl alcohol, ethanol, methanol, and sequences, combinations, and mixtures thereof. One or more aqueous solutions may be provided to the substrate in operation 305 and one or more solvents may be provided to the substrate in operation 315, both of which are described above with regard to FIG. 3. Other solvents comprising three or fewer carbon atoms may also be utilized in various embodiments.

The solvents utilized may be miscible in $CO_2$ and/or may be solvated when contacted by at least liquid $CO_2$ or supercritical $CO_2$.

At the end of the processes performed in chamber 400, the residues and/or liquids present on the substrate 406 that need to be cleaned off are removed by rotating the substrate 406 at high speed. However, a thin layer of solution from source 412 or fluid may remain on the surfaces 414, 416 of the substrate 406 after rotation of the substrate 406. Rotating the substrate may also be performed during exposure to the one or more aqueous solutions and the one or more solvents. In one example, a thin layer of one or more aqueous solution may remain on the substrate after operation 305 and during operation 310. A thin layer of one or more solvents may remain on the substrate after operation 315 and during operation 320.

In another embodiment, the chamber may be used to spin dry the substrate 406 after each wet cleaning cycle. For example, after a wet processing cycle (such as operation 305), the rotating device 449 continues to rotate the bracket 448, thus spinning the substrate 406. The spinning of the substrate 406 may remove some or all of the liquids (or reagents) that are used to process the substrate 406. The wet processing chamber 400 may also be utilized as a solvent exchange chamber which may introduce a solvent, such as acetone, through the tube 428 or the nozzle 417 to facilitate solvent exchange (such as operation 315) within the fluids remaining on the substrate 406 after an initial wet processing cycle (operation 305).

Figure 5A:
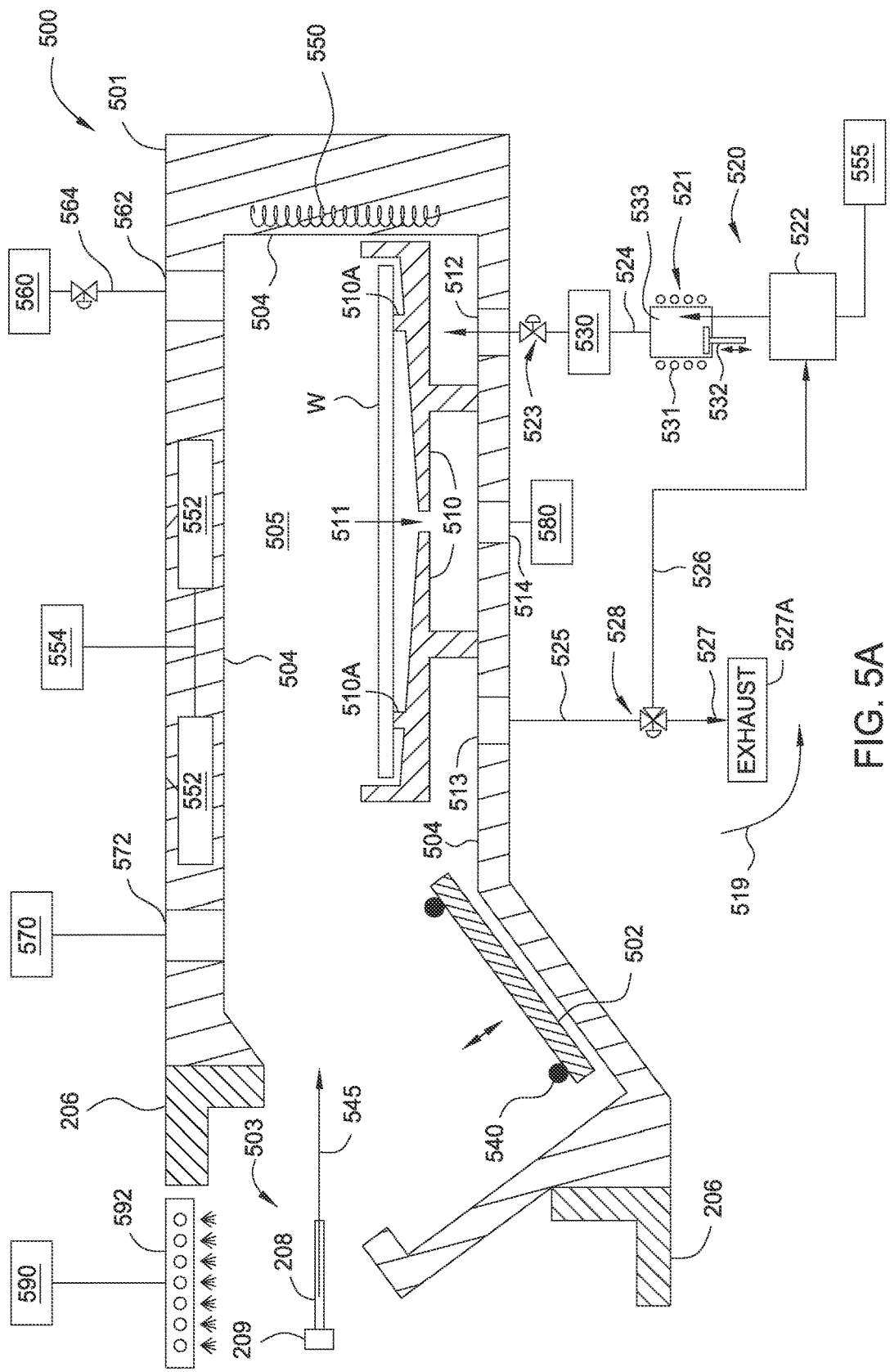
FIG. 5A illustrates a schematic, cross-sectional view of a supercritical fluid chamber according to one embodiment described herein.

FIG. 5A illustrates a cross-sectional schematic view of a supercritical fluid chamber 500 according to one embodiment. It is contemplated that the supercritical processing chamber 500, depicted in FIG. 5A, may be utilized as the supercritical processing chamber 203. Gas in the supercritical fluid chamber 500 may be a substance that is capable of transitioning into a supercritical state under certain appropriate conditions (e.g. pressure and temperature) to become a supercritical fluid. The supercritical fluids used in the supercritical fluid chamber 500 may be a substance that possesses liquid-like solvating properties and gas-like diffusion and viscosity, which enables the supercritical fluid to rapidly penetrate into voids, pores, gaps, crevices, or openings, and completely remove or dissolve various liquids, residues, or contaminants. One example of such a gas is $CO_2$. Although other commercially available gases can be used to form a supercritical fluid, $CO_2$ is the most commonly used due to its inert, non-toxic, non-flammable characteristics and its abundance in nature. Appropriate conditions to transform $CO_2$ into supercritical fluid $CO_2$ include a pressure of about 1200 psi or greater and a temperature of about 31° C. or greater, as shown in the $CO_2$ phase change diagram of FIG. 1.

The supercritical fluid chamber 500 may be configured to expose supercritical fluid to a substrate W disposed within the processing volume 505 of the supercritical fluid chamber 500. The supercritical fluid may be formed in the supercritical fluid chamber 500 or it may be formed outside the supercritical fluid chamber 500 and delivered into the supercritical fluid chamber 500. In one embodiment, liquid $CO_2$ may be delivered to the supercritical fluid chamber 500 and subsequently transformed into supercritical $CO_2$. Liquid $CO_2$ and supercritical $CO_2$ may be delivered to the supercritical fluid chamber 500 sequentially or simultaneously. In one example, liquid $CO_2$ may be provided to the chamber 500 as described in operation 330 and supercritical $CO_2$ may be provided to the chamber 500 as described in operation 345.

In one configuration, the chamber 500 may be disposed on and coupled to a transfer chamber 206 (FIG. 2A or 2B). The chamber 500 comprises a chamber body 501 which defines a processing volume 505. The chamber 500 may be made from stainless steel or other suitable structural materials that enable the chamber 500 to withstand an operating temperature and pressure sufficient to maintain a gas in its supercritical state. In one embodiment, surfaces 504 of the chamber body 501 disposed adjacent to and defining the processing volume 505 may be electrochemically polished to form a surface that has a low surface roughness (e.g., smooth surface). In another embodiment, the surfaces 504 may be coated with a material, such as Teflon® coating or chromium.

A substrate support 510 may be disposed in the processing volume 505 and coupled to the chamber body 501. The substrate support 510 further comprises a support surface 510A configured to receive the substrate W, such as a semiconductor substrate W. The support surface 510A may also be configured to actively restrain the substrate W after the substrate W has been placed on the support surface 510A. For example, the substrate support 510 may utilize electrostatic or vacuum chucking, an edge ring, or retaining pins or the like to prevent the substrate W from moving on the support surface 510A during processing. In another embodiment, the substrate support 510 may comprise a plurality of support pins. The substrate support 510 may also be configured to rotate the semiconductor substrate W during processing.

In one embodiment, the substrate support 510 includes a fluid port 511 which enables fluid provided to the processing volume 505 to surround the substrate W. For example, fluid provided to the processing volume 505 may flow through the fluid port 511 and partially or completely submerge the substrate W in the fluid. It is contemplated that the fluid port 511 enables greater fluid flow around the substrate W and may provide for improved exposure of the substrate W to the fluid.

In one embodiment, the processing volume 505 comprises a small volume to reduce the amount of supercritical fluid necessary to fill the enclosure. The chamber 500 further comprises a slit valve door 502 comprising one or more O-rings 540 coupled to the slit valve door 502. The O-rings 540 may be formed from an elastomeric material, such as rubber or silicone. A slit valve opening 503 provides access for a wet robot 208 disposed in the transfer chamber 206 to transfer and receive substrates from the processing volume 505 along the substrate transfer path 545.

It is believed that adding more solvent to the substrate W after processing in the solvent exchange chamber 202 will prevent "dry spots" from forming during supercritical processing. Preventing dry spots may also help prevent curing, cracking, or shrinking of any low-k (dielectric) material formed on the substrate W prior to performing the supercritical drying process described in detail with regard to operations 340-350. A solvent dispensing apparatus 592 may be disposed near the slit valve opening 503. The solvent dispensing apparatus 592, such as a spray bar, is configured to deliver a liquid to the substrate W prior to entry into the chamber 500 through the slit valve opening 503. In one embodiment, the solvent dispensing apparatus 592 may be configured to deliver acetone. The solvent dispensing apparatus 592 may be coupled to the chamber body 501 or to the transfer chamber 206.

A solvent source 590 is coupled to the solvent dispensing apparatus 592 and configured to provide a liquid solvent, such as acetone, for delivery to a top surface of the substrate W via the solvent dispensing apparatus 592. The solvent dispensing apparatus 592 is configured to deliver a small amount of solvent to the substrate W such that a layer of solvent completely covers the top surface of the substrate W.

In another embodiment, additional solvent may be provided to the substrate W after the substrate W is inside the chamber 500. The chamber 500 may further comprise a fluid source 580. The fluid source 580 may be adapted to provide one or more liquids, or mixtures thereof, to the chamber 500. In one embodiment, the fluid source 580 is adapted to provide a solvent, such as acetone, to the processing volume 505. The fluid source 580 may be coupled to the chamber 500 via a solvent port 514. In one example, a solvent is provided to the processing volume via the solvent port 514 as described with regard to operation 325. Solvent present in the chamber 500 may also exit the processing volume 505 via the solvent port 514. Solvent removal from the chamber may be performed with regard to operation 335.

The chamber 500 may further comprise one or more heating elements 550 configured to heat the chamber 500 during the formation of supercritical $CO_2$ and/or during depressurization of the chamber 500. The heating elements 550 may be disposed proximate to or inside the processing volume 505 of the chamber body 501. The heating elements 550 may comprise resistive heating elements, fluid channels that are configured to receive a heat control fluid, and/or other similar heating devices. The heating elements 550 may heat the fluid or gas in the processing volume 505 to a desired temperature as described with regard to operation 340.

The chamber 500 may also include one or more acoustic or sonic transducers 552, such as piezoelectric transducers (e.g., ultrasonic crystals), coupled to the surfaces 504 of the chamber body 501 in the processing volume 505 or embedded within the chamber body 501 to create acoustic or sonic waves for cleaning the chamber 500. Alternatively, the transducers 552 may be disposed outside the chamber body 501 and be positioned to direct the sonic energy to the processing volume 505 of the chamber body 501. The transducers 552 may be coupled to a power source 554 adapted to provide sufficient power for performing an ultrasonic cleaning process. The transducers 552 may also direct waves towards the substrate W to agitate the supercritical fluid within the chamber 500 during supercritical fluid processing.

A supercritical fluid delivery system 520 comprises a first fluid delivery line 524 coupled to a fluid source 555, such as a $CO_2$ supply, and the first fluid inlet 512 formed in the chamber 500. A pump 522 may be coupled to the first fluid delivery line 524 between the first fluid inlet port 512 and the fluid source 555 for delivering the pressurized fluid from the fluid source 555 into the processing volume 505 of the chamber 500. Additionally, an inlet valve 523 may be disposed on the first fluid delivery line 524 between the pump 522 and the first fluid inlet port 512 to control the flow of supercritical fluid to the processing volume 505.

Figure 5B:
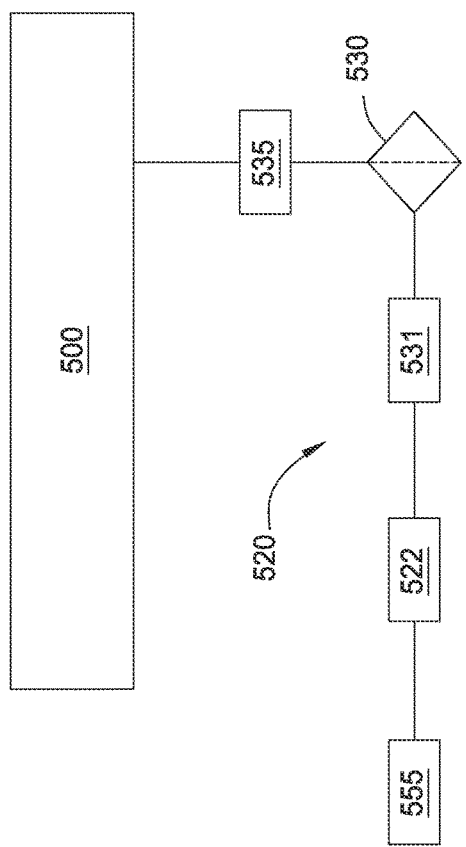
FIG. 5B schematically illustrates a supercritical fluid delivery system according to one embodiment described herein.

FIG. 5B schematically illustrates a supercritical fluid delivery system 521 according to one embodiment described herein. The supercritical fluid delivery system 521 comprises the fluid source 555, the pump 522, a heating element 531, a filter 530, and a condenser 535. The fluid delivery system 521 filters fluid in a supercritical state, but then delivers the fluid to the chamber 500 as a liquid. For example, an amount of fluid, such as liquid $CO_2$, is provided from the fluid source 555 to the pump 522, which may pressurize the fluid. The fluid is then heated by the heating element 531 to transform the liquid into its supercritical state. The supercritical fluid is then passed through the filter, which may be a high pressure gas filter, to purify the supercritical fluid. It is believed that a much higher filtration efficiency is achieved utilizing a gas filter as opposed to utilizing a liquid filter. The supercritical fluid is then condensed by the condenser 535 to return the supercritical fluid back to a liquid, which is then provided to the chamber 500. In certain embodiments described in greater detail below, the condenser 535 may be optional to allow the supercritical fluid to be provided directly to the chamber in its supercritical state.

Referring back to FIG. 5A, the chamber 500 may further comprise an optional loop 519 for re-circulating fluid to and from the chamber 500. The loop 519 may further include a filter (not shown), such as an activated charcoal filter, to purify the fluid. The loop 519 helps produce a flow of the supercritical fluid within the processing volume 505, such as a laminar flow, to help prevent stagnation of the supercritical fluid bath.

A fluid outlet 513 may be coupled to the chamber 500 for removal of the supercritical fluid from the processing volume 505. The fluid outlet 513 may release the supercritical fluid to atmosphere, may direct the used supercritical fluid to exhaust 527A and storage, or may recycle the supercritical fluid for re-use (loop 519). As shown, the fluid outlet 513 may be coupled to the pump 522 by a fluid return line 525 and a pump return line 526. An exhaust valve 528 couples the fluid return line 525 and the pump return line 526. The exhaust valve 528 directs the supercritical fluid or gas in the fluid return line 525 to either exhaust 527 (or storage) or to the pump 522 to recycle the supercritical fluid for re-use. Optionally, a condenser (not shown) may be coupled between the fluid outlet 513 and the fluid source 555 to condense the contaminants in the fluid prior to being directed to the fluid source 555.

The first fluid inlet port 512 and fluid outlet 513 may be disposed through a bottom wall of the chamber body 501. However, it is contemplated that the first fluid inlet port 512 and the fluid outlet 513 may be disposed at other areas through the walls of the chamber body 501, such as through a top wall of the chamber body 501. For example, fluid may be provided to the processing volume 505 via the first fluid inlet port 512 in the bottom wall of the chamber body 501 and fluid may be removed from the processing volume 505 via the fluid outlet 513 located in the top wall of the chamber body 501. The first fluid inlet port 512 may be adapted to receive a gas or liquid, such as $CO_2$. In certain embodiments, the first fluid inlet port 512 may be coupled to nozzles, showerheads, or other fluid delivery devices to direct the fluid towards the substrate W.

In certain embodiments, the chamber 500 may comprise a purge gas source 560. The purge gas source 560 may be coupled to the second fluid inlet port 562 via a second fluid delivery line 564. The purge gas source 560 may be adapted to provide a purge gas, such as pure nitrogen ($N_2$), argon (Ar), helium (He), or other high purity gases to the processing volume 505. The chamber 500 may further comprise a pressurization apparatus 570, such as a compressor, adapted to pressurize the processing volume 505 of the chamber 500. The pressurization apparatus 570 may be coupled to the chamber through a pressure valve 572. In one embodiment, the pressurization apparatus 570 may pressurize a gas, such as the purge gas, after the gas has been provided to the processing volume 505. In another embodiment, the pressurization apparatus 570 may be coupled to the purge gas source 560 and may be adapted to pressurize the purge gas prior to delivery to the chamber 500. In operation, the pressurization apparatus 570 may pressurize a purge gas in the chamber 500 to between about 1100 psi and about 2000 psi prior to introduction of the supercritical fluid to the processing volume 505.

The above embodiments describe a supercritical fluid chamber providing supercritical fluid that may be formed inside the processing volume 505 after a non-supercritical fluid is supplied to the chamber 500. In an embodiment where supercritical fluid is delivered to the chamber 500 already in its supercritical phase, such as described in operation 345, the supercritical fluid delivery system may further comprise a phase transition apparatus 521. The phase transition apparatus 521 may be disposed on the first fluid delivery line 524 between the pump 522 and the first fluid inlet port 512. A filter 530 may be disposed on the first fluid delivery line 524 between the first fluid inlet port 512 and the phase transition apparatus 521. The filter 530 may be capable of operating under pressures of about 3000 psi, or below, to filter the supercritical fluid before it enters the chamber 500 and to remove impurities that may be present in the supercritical fluid. The filter 530 may include a filter medium that has a pore size of about 3 nanometers (nm), and may be formed from an aluminum oxide ($Al_2O_3$) material.

The phase transition apparatus 521 comprises a processing region 533, a compression device 532, and a heating element 531. In one embodiment, the pump 522 supplies $CO_2$ gas from the fluid source 555 to the processing region 533 of the phase transition apparatus 521. The $CO_2$ gas may be pressurized by the compression device 532 and/or heated by the heating element 531 to predetermined levels to create a supercritical fluid therein. In one embodiment, $CO_2$ may heated to about 40° C. and pressurized to about 95 bar. The resulting supercritical $CO_2$ may then be delivered through the first fluid delivery line 524 to the chamber 500 through the first fluid inlet port 512.

When the substrate W in the chamber 500 has been processed with supercritical $CO_2$, a depressurization process occurs in the chamber 500. The depressurization process is described with regard to operation 350. In one embodiment, isothermal depressurization of the chamber 500 may be performed by maintaining the chamber 500 at a desired temperature, such as about 40° C., while the pressure is reduced to a desired pressure, such as about 21 bar, before the gases remaining in the chamber 500 are vented from the chamber 500. In one example, the depressurization process proceeds at a rate of about 200 psi/min until the pressure within the chamber is about 400 psi. When the pressure is at about 400 psi, a greater depressurization rate may be utilized to further depressurize the chamber 500. The depressurization process is described with regard to operation 350.

The controlled depressurization process is performed in an isothermal environment which receives energy input from the heating element 550 to maintain a desired temperature during depressurization of the chamber. The chamber 500 pressure is reduced by releasing supercritical fluid and/or gases through the fluid outlet 513 to the exhaust 527 or tank (not shown) formed within the pump 522. Although shown as being formed through a bottom of the chamber 500, the fluid outlet 513 may be formed through a top of the chamber 500. For example, the fluid outlet 513 may be formed through the top of the chamber adjacent the second fluid inlet 562. The gas removed from the chamber 500 to exhaust 527A travels through the fluid return line 525 to the exhaust valve 528 which may be selected to exhaust 527A or return the gas to the pump 522 through the pump return line 526. The substrate W may be optionally heated during venting to prevent cooling of the substrate W and to prevent moisture uptake or deposition.

Figure 6:
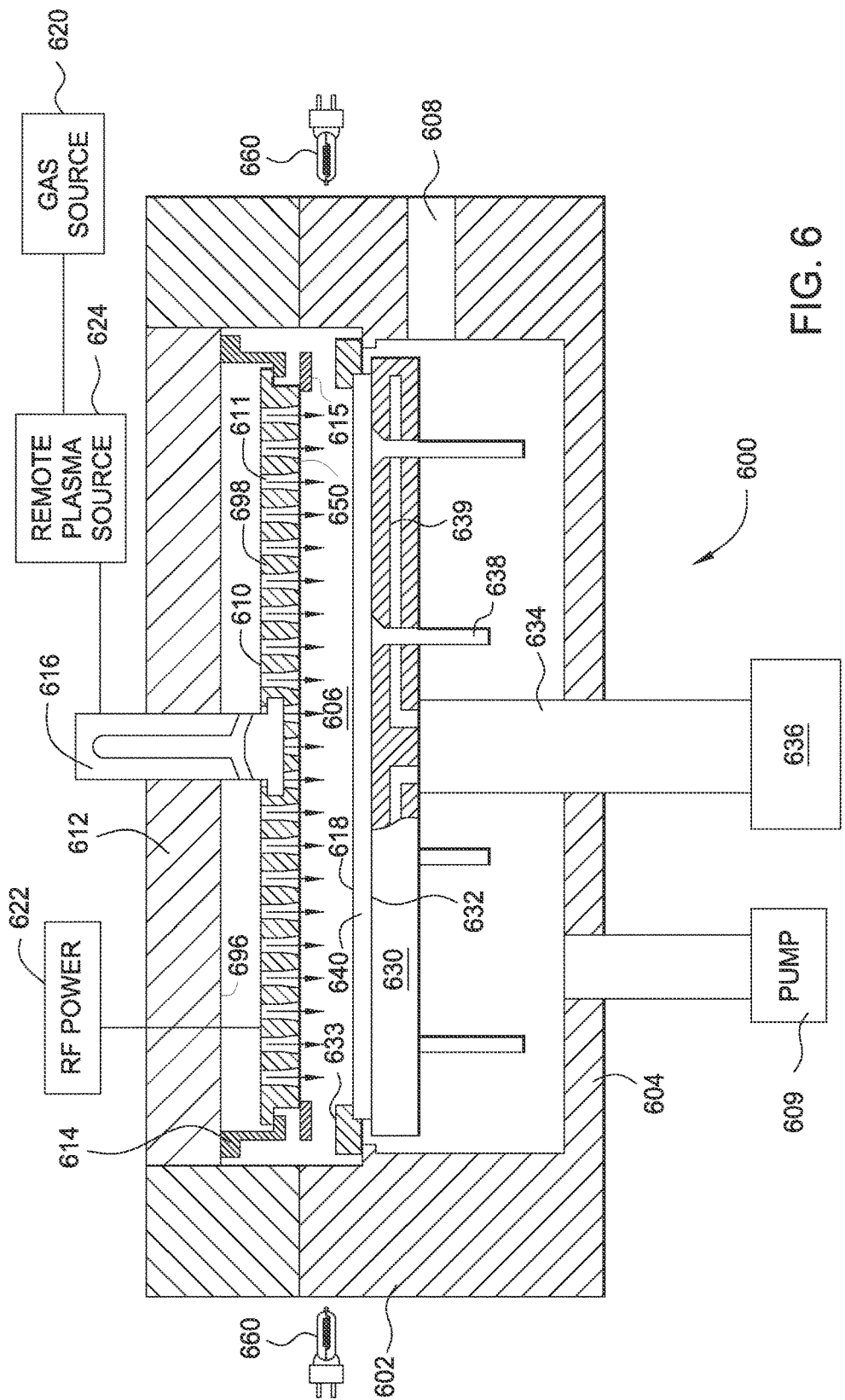
FIG. 6 illustrates a schematic, cross sectional view of a post processing chamber according to one embodiment described herein.

FIG. 6 illustrates a cross-sectional view of a post processing chamber 600. More specifically, FIG. 6 provides a plasma generation chamber or electromagnetic radiation chamber, which may be the post processing chamber 204. A substrate 640 may optionally be transferred from the supercritical fluid chamber 500 to the post processing chamber 600 as described with regard to operation 355. The chamber 600 generally includes walls 602 and a bottom 604 which encloses a process volume 606. A gas distribution plate 610 and substrate support assembly 630 may be disposed in the process volume 606. The process volume 606 may be accessed through a slit valve opening 608 formed through the wall 602 which enables the substrate 640 to be transferred in and out of the chamber 600. Although illustratively shown as a plasma chamber, the chamber 600 may also be adapted to irradiate the substrate with electromagnetic energy, such as irradiate the substrate with light containing one or more of the ultraviolet wavelengths.

The substrate support assembly 630 includes a substrate receiving surface 632 for supporting the substrate 640 thereon. A stem 634 couples the support assembly 630 to a lift system 636, which raises and lowers the substrate support assembly 630 between substrate transfer and processing positions. A shadow frame 633 may be optionally placed over a periphery of the substrate 640 when processing to prevent deposition on the edge of the substrate 640. Lift pins 638 may be moveably disposed through the substrate support assembly 630 and may be configured to space the substrate 640 from the substrate receiving surface 632 to facilitate exchange of the substrate with a robot blade. The substrate support assembly 630 may also include heating and or cooling elements 639 utilized to maintain the substrate support assembly 630 at a desired temperature.

The gas distribution plate 610 may be coupled to a backing plate 612 and its periphery by a suspension 614. The gas distribution plate 610 may also be coupled to the backing plate 612 by one or more center supports 616 to help prevent and/or control the straightness/curvature of the gas distribution plate 610. In one embodiment, the gas distribution plate 610 may be in different configurations with different dimensions. The distribution plate 610 may comprise a plurality of perforations 611 disposed between the upper surface 698 and lower surface 650 of the distribution plate 610. A gas source 620 may be coupled to the backing plate 612 to provide gas to a plenum defined between the gas distribution plate 610 and backing plate 612. The gas from the source 620 flows from the perforations 611 formed in the gas distribution plate 610 to the process volume 606.

A vacuum pump 609 may be coupled to the chamber 600 to maintain the process volume 606 at a desired pressure. An RF power source 622 may be coupled to the backing plate 612 and/or to the gas distribution plate 610 to provide an RF power to create an electric field between the gas distribution plate 610 and the substrate support assembly 630 so that a plasma may be generated from the gases present between the gas distribution plate 610 and the substrate support assembly 630. Various frequencies, such as a frequency of 13.56 MHz, may be used to form the plasma in the process volume 606. In one embodiment, $O_2$ plasma may be applied to the substrate 640 at about 75 W for about 10 seconds. The additional plasma treatment may be capable of removing organic impurities that may be present on the substrate 640.

A remote plasma source 624, such as an inductively coupled remote plasma source, may also be coupled between the gas source 620 and the backing plate 612. The RPS 624 may be used to from a plasma in the processing volume 606. The plasma travels through the processing volume 706 to a top surface 618 of the substrate 640. In one embodiment, an electromagnetic radiation source 660, such as an ultraviolet light source, may be coupled to the chamber 600. The electromagnetic radiation source 660 may be coupled a power source (not shown) and may be positioned at any convenient location either inside the chamber 600 or outside the chamber 600. In one configuration, the electromagnetic radiation source 660 is positioned outside the chamber 600 so that it can transmit the generated electromagnetic energy through a window (not shown), which may be coupled to a portion of a wall 602 of the chamber 600, to the substrate's surface. The electromagnetic radiation source 660 may be positioned to irradiate the top surface 618 of the substrate 640. The electromagnetic radiation source 660 may be adapted to provide ultraviolet light to the substrate 640 having a wavelength between about 50 nm and about 500 nm. In one embodiment, the radiation source 660 may be configured to deliver ultraviolet light having a wavelength of about 172 nm.

While the foregoing is directed to embodiments of the present disclosure, other and further embodiments of the disclosure may be devised without departing from the basic scope thereof, and the scope thereof is determined by the claims that follow.

What is claimed is:

1. A method for forming a dielectric material on a substrate, comprising:
    exposing a substrate to an aqueous solution in a first processing chamber;
    wet transferring the substrate to a second processing chamber;
    exposing the substrate to a solvent in the second processing chamber;
    wet transferring the substrate to a third processing chamber;
    delivering the solvent to the third processing chamber;
    removing the solvent by providing liquid $CO_2$ and supercritical $CO_2$ to the third processing chamber;
    heating and pressurizing the third processing chamber to obtain a supercritical fluid comprising $CO_2$ in the third processing chamber; and
    depressurizing the third processing chamber.

2. The method of claim 1, wherein the aqueous solution comprises tetraethylorthosilicate (TEOS), water, ethanol, and ammonia.

3. The method of claim 2, wherein the aqueous solution is spin coated on the substrate.

4. The method of claim 1, wherein the solvent comprises acetone.

5. The method of claim 1, wherein the solvent is removed from the third chamber after the liquid $CO_2$ is provided to the third processing chamber and the third processing chamber is pressurized.

6. The method of claim 5, wherein a thin layer of solvent remains on the substrate after the providing the liquid $CO_2$ and the pressurizing the third processing chamber.

7. The method of claim 1, wherein at least a portion of the supercritical fluid is removed from the third processing chamber prior to depressurizing the third processing chamber.

8. The method of claim 1, further comprising post processing the substrate in a UV processing chamber.

9. The method of claim 1, wherein the wet transferring comprises a water transfer operation to the second processing chamber and a solvent transfer operation to the third processing chamber.

10. The method of claim 1, wherein the third processing chamber is heated to maintain the supercritical $CO_2$ in a supercritical state.

11. A method for forming a dielectric material on a substrate, comprising:
    exposing a substrate to an aqueous solution comprising tetraethylorthosilicate (TEOS) in a wet processing chamber;
    transferring the substrate to a solvent exchange chamber with a layer of the aqueous solution remaining on the substrate;
    exposing the substrate to acetone in the solvent exchange chamber;
    positioning the substrate within a processing volume of a supercritical fluid chamber, wherein the positioning the substrate comprises wet transferring the substrate to the supercritical fluid chamber with a layer of the acetone remaining on the substrate;
    delivering the acetone to the supercritical fluid chamber;
    removing the acetone by providing liquid $CO_2$ to the supercritical fluid chamber and pressurizing the supercritical fluid chamber;
    heating the supercritical fluid chamber to transform the liquid $CO_2$ to supercritical $CO_2$;
    delivering additional supercritical $CO_2$ to the processing volume of the supercritical fluid chamber; and
    depressurizing the supercritical fluid chamber.

12. The method of claim 11, wherein the layer of the acetone remains on the substrate after the providing liquid $CO_2$ to the supercritical fluid chamber and the pressurizing the supercritical fluid chamber.

13. The method of claim 11, wherein the supercritical fluid chamber is pressurized to at least about 95 bar.

14. The method of claim 13, wherein the supercritical fluid chamber is heated to at least about 40° C.

15. The method of claim 11, wherein the layer of the acetone is solvated by the supercritical $CO_2$.

16. The method of claim 15, wherein the supercritical $CO_2$ is sublimated by depressurizing the supercritical fluid chamber.

17. The method of claim 11, further comprising post processing the substrate in a UV processing chamber.

18. A substrate processing platform apparatus, comprising:
    a wet processing chamber configured to expose a substrate to an aqueous solution via a spin-on process;
    a solvent exchange chamber having a distillation unit coupled thereto, the solvent exchange chamber configured to expose the substrate to a solvent;
    a supercritical fluid chamber configured to form a supercritical fluid therein, wherein the supercritical fluid chamber has at least one inlet configured to receive liquid $CO_2$ and supercritical $CO_2$ and at least one outlet, the inlet and the outlet oriented on opposite sides of the supercritical fluid chamber; and
    a robot configured to transfer the substrate between the wet processing chamber, the solvent exchange chamber, and the supercritical fluid chamber.

19. The apparatus of claim 18, further comprising:
    acoustic or sonic transducers coupled to the supercritical fluid chamber.

* * * * *